(12) United States Patent
Ikeda

(10) Patent No.: US 12,046,592 B2
(45) Date of Patent: Jul. 23, 2024

(54) STATIC ELECTRICITY PROTECTION CIRCUIT, SEMICONDUCTOR DEVICE, AND ELECTRONIC APPARATUS

(71) Applicant: SEIKO EPSON CORPORATION, Tokyo (JP)

(72) Inventor: Masuhide Ikeda, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 390 days.

(21) Appl. No.: 17/577,774

(22) Filed: Jan. 18, 2022

(65) Prior Publication Data

US 2022/0231009 A1    Jul. 21, 2022

(30) Foreign Application Priority Data

Jan. 20, 2021   (JP) .................. 2021-007139

(51) Int. Cl.
   *H01L 27/02*   (2006.01)
   *H02H 9/04*   (2006.01)

(52) U.S. Cl.
   CPC ......... *H01L 27/0255* (2013.01); *H02H 9/046* (2013.01)

(58) Field of Classification Search
   CPC .................. H01L 27/0255; H02H 9/046
   See application file for complete search history.

(56) References Cited

U.S. PATENT DOCUMENTS

| | | | |
|---|---|---|---|
| 9,871,135 B2 * | 1/2018 | Lin | H01L 21/28518 |
| 9,905,687 B1 * | 2/2018 | Zhu | H01L 29/7801 |
| 2004/0135141 A1 * | 7/2004 | Pequignot | H01L 27/0814 |
| | | | 257/46 |
| 2010/0181621 A1 | 7/2010 | Chang et al. | |
| 2011/0175199 A1 * | 7/2011 | Lin | H01L 29/0692 |
| | | | 257/605 |
| 2014/0225156 A1 * | 8/2014 | Zhan | H01L 27/0277 |
| | | | 257/164 |
| 2014/0347771 A1 * | 11/2014 | Zhan | H02H 9/046 |
| | | | 257/111 |

(Continued)

FOREIGN PATENT DOCUMENTS

| | | |
|---|---|---|
| JP | 2008-098479 | 4/2008 |
| JP | 2012-515442 | 7/2012 |

*Primary Examiner* — Victor A Mandala

(74) *Attorney, Agent, or Firm* — Rankin, Hill & Clark LLP

(57) ABSTRACT

In a static electricity protection circuit, an N+ embedded region is provided, extending over an upper surface of a P-type P semiconductor substrate. One N--semiconductor region, another N--semiconductor region, and an N- common impurity region are provided in an upward direction from the N+ embedded region. The one N--semiconductor region and the other N--semiconductor region are coupled together via the N- common impurity region. A P- impurity region is provided in the upward direction from the one N--semiconductor region. Another P- impurity region is provided in the upward direction from the other N--semiconductor region. A diode formed by the one P- impurity region and the one N--semiconductor region and a diode formed by the other P- impurity region and the other N--semiconductor region are coupled in opposite directions to each other via the N- common impurity region.

9 Claims, 7 Drawing Sheets

(56) References Cited

U.S. PATENT DOCUMENTS

| | | | | |
|---|---|---|---|---|
| 2015/0002967 A1* | 1/2015 | Kawase | .............. | H01L 27/0255 |
| | | | | 257/132 |
| 2015/0270333 A1* | 9/2015 | Yang | ................ | H01L 29/66659 |
| | | | | 438/151 |
| 2015/0311193 A1* | 10/2015 | Laine | .................. | H01L 29/0649 |
| | | | | 257/491 |
| 2015/0371985 A1* | 12/2015 | Edwards | ........... | H01L 29/66386 |
| | | | | 438/134 |
| 2016/0268245 A1* | 9/2016 | Chen | ................... | H01L 21/8222 |
| 2017/0373053 A1* | 12/2017 | Zhan | ................... | H01L 27/0251 |
| 2019/0103396 A1* | 4/2019 | Zhan | ................... | H01L 29/0821 |
| 2022/0223584 A1* | 7/2022 | Appaswamy | ....... | H01L 29/0692 |

* cited by examiner

STATIC ELECTRICITY PROTECTION CIRCUIT, SEMICONDUCTOR DEVICE, AND ELECTRONIC APPARATUS

The present application is based on, and claims priority from JP Application Serial Number 2021-007139, filed Jan. 20, 2021, the disclosure of which is hereby incorporated by reference herein in its entirety.

BACKGROUND

1. Technical Field

The present disclosure relates to a static electricity protection circuit, a semiconductor device, and an electronic apparatus.

2. Related Art

JP-T-2012-515442 discloses a device having a diode structure formed of an impurity layer at a substrate surface, as an integrated static electricity protection device for signal and power supply.

However, in the device described in JP-T-2012-515442, where a diode formed at the substrate surface is used for a component element as a static electricity protection circuit, a current flowing near the substrate surface locally concentrates at the diode and therefore the hold voltage of the diode rises, that is, the breakdown voltage thereof rises, thus causing the amount of heat generation due to the breakdown current to be greater than heat radiation. This poses a risk of breaking the component element.

SUMMARY

A static electricity protection circuit according to an aspect of the present disclosure is coupled in parallel to a protection target circuit. The static electricity protection circuit includes: a first semiconductor region and a second semiconductor region that are of a first conductivity type; a common impurity region having a higher carrier concentration of the first conductivity type than the first semiconductor region and the second semiconductor region; an embedded region having a higher carrier concentration of the first conductivity type than the common impurity region; and a first impurity region and a second impurity region that are of a second conductivity type. The embedded region is provided, extending over a surface in a stacking direction that is one surface of a semiconductor substrate of the second conductivity type. The first semiconductor region, the second semiconductor region, and the common impurity region are provided in the stacking direction from the embedded region and coupled to the embedded region. The first semiconductor region and the second semiconductor region are coupled together via the common impurity region. The first impurity region is provided in the stacking direction from the first semiconductor region and coupled to the first semiconductor region. The second impurity region is provided in the stacking direction from the second semiconductor region and coupled to the second semiconductor region. A first diode formed by the first impurity region and the first semiconductor region and a second diode formed by the second impurity region and the second semiconductor region are coupled in opposite directions to each other via the common impurity region.

A semiconductor device according to another aspect of the present disclosure includes the foregoing static electricity protection circuit.

An electronic apparatus according to still another aspect of the present disclosure includes the foregoing semiconductor device.

DESCRIPTION OF EXEMPLARY EMBODIMENTS

Figure 1:
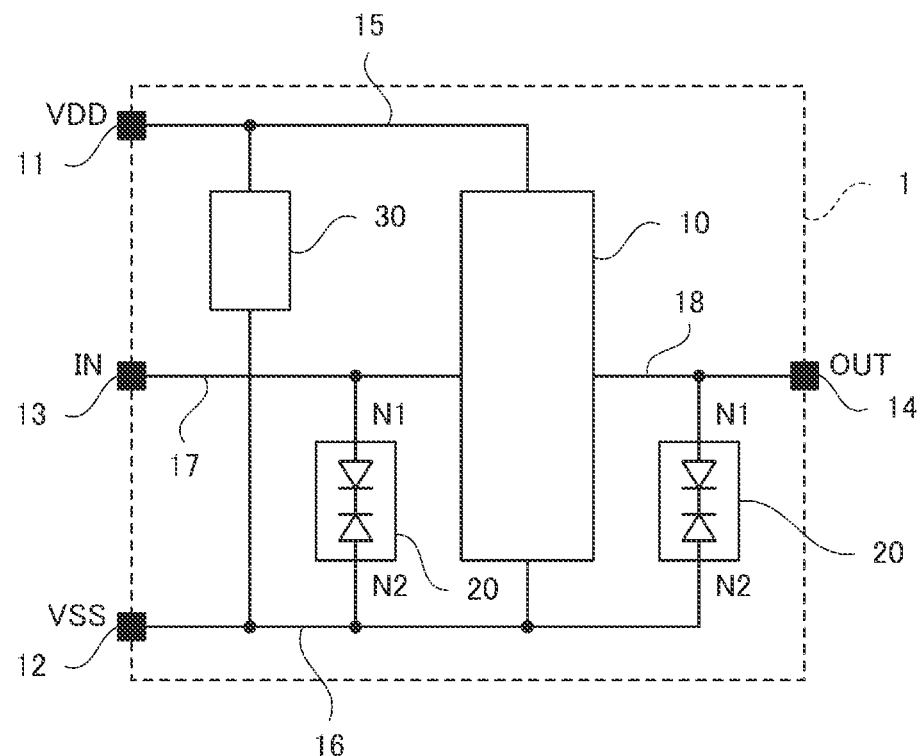
FIG. 1 is a block diagram of a semiconductor device having a static electricity protection circuit according to an embodiment.

The configuration of a semiconductor device having a static electricity protection circuit according to an embodiment will now be described with reference to FIG. 1.

A semiconductor device 1 according to this embodiment is a semiconductor device manufactured using a planer technique. The semiconductor device 1 is formed of an internal circuit 10, a static electricity protection circuit 20, and a power supply protection circuit 30 or the like.

The semiconductor device 1 has a power supply terminal 11 coupled to a positive power supply voltage VDD, a grounding terminal 12 coupled to a ground potential VSS, an input terminal 13 inputting an input signal IN to the internal circuit 10, and an output terminal 14 outputting an output signal OUT of the internal circuit 10, or the like.

The power supply terminal 11 and the internal circuit 10 are coupled together via a power supply wiring 15 supplying the power supply voltage VDD to the internal circuit 10. The grounding terminal 12 and the internal circuit 10 are coupled together via a grounding wiring 16 supplying the ground potential VSS to the internal circuit 10. The input terminal 13 and the internal circuit 10 are coupled together via an input wiring 17 transmitting the input signal IN to the internal circuit 10. The output terminal 14 and the internal circuit 10 are coupled together via an output signal line 18 transmitting the output signal OUT from the internal circuit 10 to the output terminal 14.

Each of the terminals may be arranged in a plural number, depending on the configuration of the internal circuit 10.

The internal circuit 10 is, for example, a circuit including an active element such as a CMOS transistor. The internal circuit 10 may employ various circuit configurations, depending on the use of the semiconductor device 1. The CMOS transistor refers to a complementary metal-oxide semiconductor.

The static electricity protection circuit 20 is a circuit for protecting the internal circuit 10 from static electricity applied to the input terminal 13 and the output terminal 14. For example, when static electricity is applied between the output terminal 14 and the grounding terminal 12, the static electricity protection circuit 20 with a configuration including a bidirectional diode restrains a rise in the voltage induced in the internal circuit 10 and thus protects the internal circuit 10. The voltage induced in the internal circuit 10 by the applied static electricity and restrained from rising by the static electricity protection circuit 20 is referred to as a hold voltage.

The static electricity protection circuit 20 has two nodes, that is, a node N1 coupled to one end of the bidirectional diode forming the static electricity protection circuit 20, and a node N2 coupled to the other end.

In the static electricity protection circuit 20 protecting the internal circuit 10 from the static electricity applied to the input terminal 13, the node N1 is coupled to the input wiring 17 and the node N2 is coupled to the grounding wiring 16. In the static electricity protection circuit 20 protecting the internal circuit 10 from the static electricity applied to the output terminal 14, the node N1 is coupled to the output signal line 18 and the node N2 is coupled to the grounding wiring 16. That is, the static electricity protection circuit 20 is coupled in parallel to the internal circuit 10, which is the protection target circuit, between the terminal to which static electricity may be applied and the ground potential VSS.

The power supply protection circuit 30 is a protection circuit configured differently from the static electricity protection circuit 20. The power supply protection circuit 30 has, for example, a clamping circuit including a clamping element such as a diode and has a function of restraining a rise in the voltage induced in the internal circuit 10 and protecting the internal circuit 10 when an overvoltage including static electricity or the like is applied between the power supply terminal 11 and the grounding terminal 12.

Details of the static electricity protection circuit 20 according to this embodiment will now be described, based on several specific examples.

In the examples, an example case where a first conductivity type is N-type and where a second conductivity type is P-type is described. However, the first conductivity type may be P-type and the second conductivity type may be N-type. Also, in order to facilitate understanding of the description corresponding to the illustrations referred to below, various elements are defined as follows:

a first semiconductor region is an N--semiconductor region 2041;
a second semiconductor region is an N--semiconductor region 2042;
a common impurity region is an N- common impurity region 507;
an embedded region is an N+ embedded region 517;
a first impurity region is a P- impurity region 2061;
a second impurity region is a P- impurity region 2062;
a P-type semiconductor substrate is a P semiconductor substrate 203;
a surface in a stacking direction that is one surface of the P semiconductor substrate 203 is an upper surface in each illustration, that is, the stacking direction is an upward direction in each illustration;
a first diode is a diode 201;
a second diode is a diode 202;
a first electrode is an electrode 2151;
a second electrode is an electrode 2152;
a first impurity region semiconductor layer is an impurity region semiconductor layer 2091;
a second impurity region semiconductor layer is an impurity region semiconductor layer 2092;
a first metal compound layer is a metal compound layer 2111;
a second metal compound layer is a metal compound layer 2112; and
a common impurity region semiconductor layer is a common impurity region semiconductor layer 208.

In the examples, for the sake of convenience, the stacking direction from the impurity layers and the metal compound layers or the like is described as the upward direction from the upper surface as the one surface. However, it should be understood that when the layers are stacked at the lower surface, the stacking direction is the downward direction from the lower surface.

Example 1

A static electricity protection circuit 20a as Example 1 of the static electricity protection circuit 20 shown in FIG. 1 will now be described with reference to FIG. 2.

The static electricity protection circuit 20a has the N-type N--semiconductor region 2041 and the N-type N--semiconductor region 2042, the N- common impurity region 507 having a higher N-type carrier concentration than the N--semiconductor region 2041 and the N--semiconductor region 2042, the N+ embedded region 517 having a higher N- type carrier concentration than the N- common impurity region 507, and the P-type P- impurity region 2061 and the P-type P- impurity region 2062.

Also, the static electricity protection circuit 20a has the electrode 2151, the impurity region semiconductor layer 2091 having a higher P-type carrier concentration than the P- impurity region 2061, and the metal compound layer 2111, and also has the electrode 2152, the impurity region semiconductor layer 2092 having a higher P-type carrier concentration than the P- impurity region 2062, and the metal compound layer 2112.

The N+ embedded region 517 is provided, extending over an upper surface of the P semiconductor substrate 203. The P semiconductor substrate 203 is a semiconductor substrate having a P polarity. Each region forming the static electricity protection circuit 20a is, for example, a region formed by diffusing an impurity in the P semiconductor substrate 203.

The N--semiconductor region 2041, the N--semiconductor region 2042, and the N- common impurity region 507 are provided in the upward direction from the N+ embedded region 517 and coupled to the N+ embedded region 517. The N--semiconductor region 2041 and the N--semiconductor region 2042 are coupled together via the N- common impurity region 507.

The P− impurity region 2061 is provided in the upward direction from the N−−semiconductor region 2041 and coupled to the N−−semiconductor region 2041. The P− impurity region 2062 is provided in the upward direction from the N−−semiconductor region 2042 and coupled to the N−−semiconductor region 2042.

The impurity region semiconductor layer 2091 is provided in the upward direction from the P− impurity region 2061 and coupled to the P− impurity region 2061. The metal compound layer 2111 is provided in the upward direction from the impurity region semiconductor layer 2091 and coupled to the impurity region semiconductor layer 2091. The electrode 2151 is provided in the upward direction from the metal compound layer 2111 and coupled to the metal compound layer 2111. The electrode 2151 is coupled to the node N1.

The impurity region semiconductor layer 2092 is provided in the upward direction from the P− impurity region 2062 and coupled to the P− impurity region 2062. The metal compound layer 2112 is provided in the upward direction from the impurity region semiconductor layer 2092 and coupled to the impurity region semiconductor layer 2092. The electrode 2152 is provided in the upward direction from the metal compound layer 2112 and coupled to the metal compound layer 2112. The electrode 2152 is coupled to the node N2.

In the above arrangements of the regions, the P− impurity region 2061 and the N−−semiconductor region 2041 together form the diode 201. The P− impurity region 2062 and the N−−semiconductor region 2042 together form the diode 202. The anode of the diode 201 is coupled to the electrode 2151. The anode of the diode 202 is coupled to the electrode 2152. The cathodes of the diode 201 and the diode 202 are coupled together via the N− common impurity region 507. That is, the diode 201 and the diode 202 are coupled in the opposite directions so that the forward directions of the diodes are opposite to each other.

The common impurity region semiconductor layer 208 is a region having a higher N-type carrier concentration than the N− common impurity region 507. The common impurity region semiconductor layer 208 is provided in the upward direction from the N− common impurity region 507, is coupled to the N− common impurity region 507, and is provided in such a way that a common cathode terminal can be coupled thereto.

The hold voltage of the static electricity protection circuit 20a is decided by the withstand voltage of the diode 201 and the withstand voltage of the diode 202. Specifically, the hold voltage of the static electricity protection circuit 20a is the sum of the reverse voltage of one diode of the diode 201 and the diode 202 and the forward voltage of the other diode. The static electricity protection circuit 20a is configured in such a way that the withstand voltage of the diode 201 and the withstand voltage of the diode 202 can be separately set. Therefore, a positive hold voltage and a negative hold voltage can be separately set.

Figure 2:
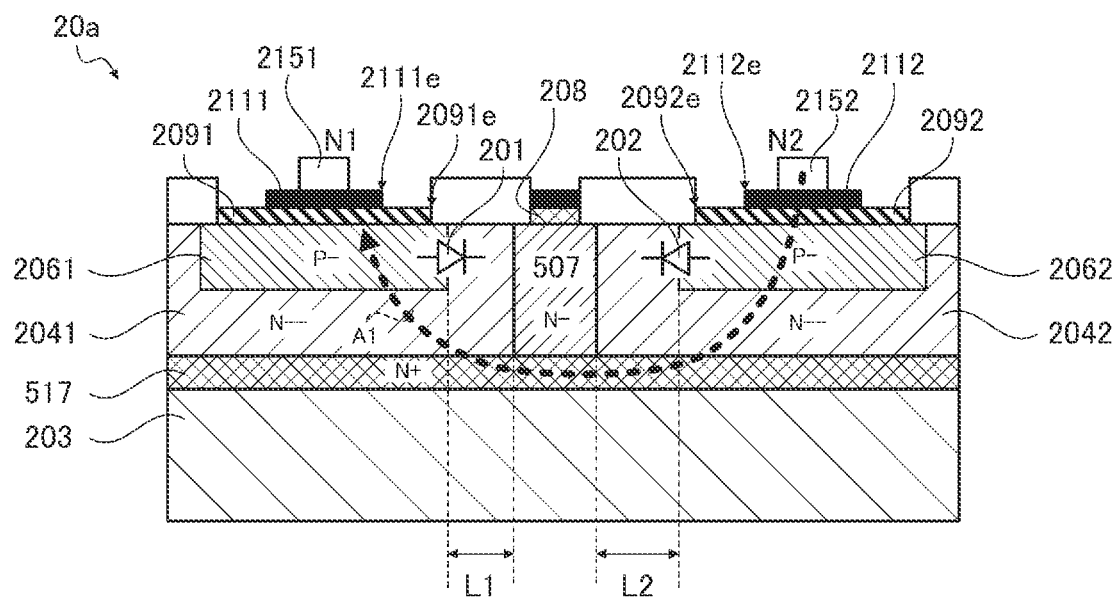
FIG. 2 is a cross-sectional view schematically showing the configuration of a static electricity protection circuit according to Example 1 of the embodiment.

Specifically, as shown in FIG. 2, a distance L1 is provided between the P− impurity region 2061 and the N− common impurity region 507, and a distance L2 is provided between the P− impurity region 2062 and the N− common impurity region 507, and the distance L1 and the distance L2 are made different from each other. Thus, a positive hold voltage and a negative hold voltage can be separately set.

Figure 3:
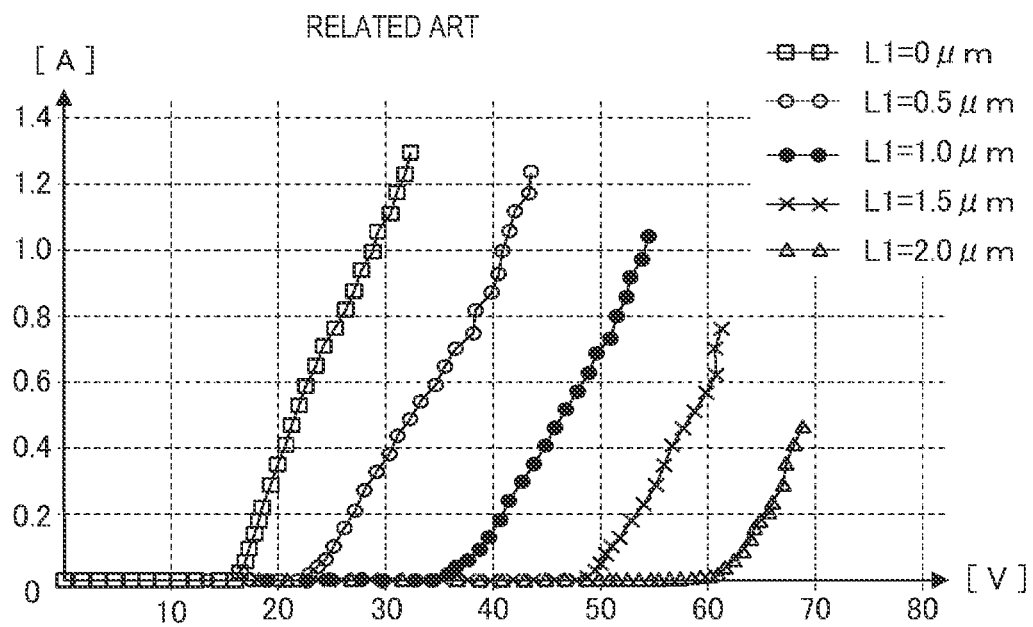
FIG. 3 is a graph showing the difference in the withstand voltage characteristic of a first diode when the distance between a first impurity region and a common impurity region is changed according to the related art.
Figure 4:
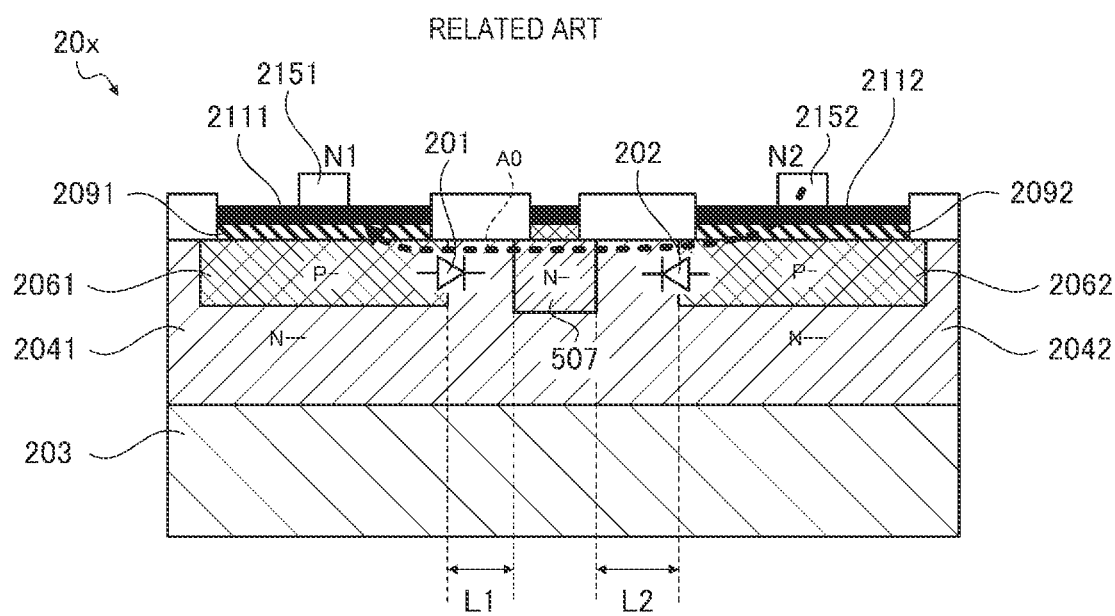
FIG. 4 is a cross-sectional view schematically showing the configuration of a static electricity protection circuit according to the related art.

The effects of the distance L1 and distance L2 will now be described with reference to FIGS. 3 and 4. FIG. 3 is a graph showing the difference in the withstand voltage characteristic of the diode 201 in a related-art static electricity protection circuit 20x shown in FIG. 4, where the distance L1 in the diode 201 is changed by 0.5 μm each, from 0 μm to 2.0 μm. The related-art static electricity protection circuit 20x does not have the N+ embedded region 517, as shown in FIG. 4. In the static electricity protection circuit 20x, the N−−semiconductor region 2041 and the N−−semiconductor region 2042 are not separated from each other by the N− common impurity region 507.

As shown in FIG. 3, in the diode 201, the withstand voltage rises as the distance L1 is increased, whereas the withstand voltage drops as the distance L1 is reduced. Similarly, in the diode 202, though not illustrated, the withstand voltage rises as the distance L2 is increased, whereas the withstand voltage drops as the distance L2 is reduced. The distances L1, L2 have a correlation with the withstand voltage. Therefore, a necessary withstand voltage can be set, based on the correlation.

However, in the related-art static electricity protection circuit 20x shown in FIG. 4, when the distance L1 or the distance L2 is increased to set a high hold voltage, the amount of heat generation due to the breakdown current increases, posing a problem in that the static electricity protection circuit 20x is susceptible to thermal destruction. Specifically, for example, when negative static electricity is applied to the node N1, that is, to the electrode 2151 on the anode side of the diode 201, in relation to the node N2 with ground potential, that is, in relation to the electrode 2152 on the anode side of the diode 202 with ground potential, the breakdown current due to the breakdown of the diode 201 flows through a vicinity of the surface, where the impedance is relatively low, as in a current path A0 indicated by a dashed-line arrow in FIG. 4. The vicinity of the surface is a vicinity of the surface where the P− impurity region 2062, the N−−semiconductor region 2042, the N− common impurity region 507, the N−−semiconductor region 2041, and the P− impurity region 2061 are arranged in order on the side opposite to the deep layer side where the P semiconductor substrate 203 extends, in the static electricity protection circuit 20x having the multi-layer structure. The rise in the hold voltage causes large power concentration and thus causes generation of heat, leading to destruction at a low heat-resistant site.

For example, as can be seen in the graph of the withstand voltage characteristic of the diode 201 shown in FIG. 3, when the distance L1 is 1.0 μm, destruction occurs at a hold voltage of approximately 30 to 50 V and just over A, that is, at approximately 50 W, whereas when the distance L1 is 2.0 μm, destruction occurs at a hold voltage of approximately 60 to 70 V and 0.5 A, that is, within a range lower than 35 W.

In contrast, in the static electricity protection circuit 20a according to this example, the N+ embedded region 517 is provided in such a way as to extend over the upper surface of the P semiconductor substrate 203, and the N−−semiconductor region 2041, the N−−semiconductor region 2042, and the N− common impurity region 507, which are provided in the upper layer, are coupled to the N+ embedded region 517.

The N+ embedded region 517 has a higher N-type carrier concentration and a lower impedance than the N− common impurity region 507. Therefore, the breakdown current due to the breakdown of the diode 201 flows via the deep layer side, where the impedance is lower, as in a current path A1 indicated by a dashed-line arrow in FIG. 2. As a result, the breakdown current concentrating in the vicinity of the surface is dispersed to the deep layer side.

In this example, as shown in FIG. 2, an end part 2111e on the near side to the N− common impurity region 507, of the metal compound layer 2111, that is, the end part on the right side of the metal compound layer 2111 in FIG. 2, is spaced apart from an end part 2091e on the near side to the N− common impurity region 507, of the impurity region semiconductor layer 2091, toward the end part on the far side, that is, toward the end part on the left side of the metal compound layer 2111 in FIG. 2.

Figure 5:
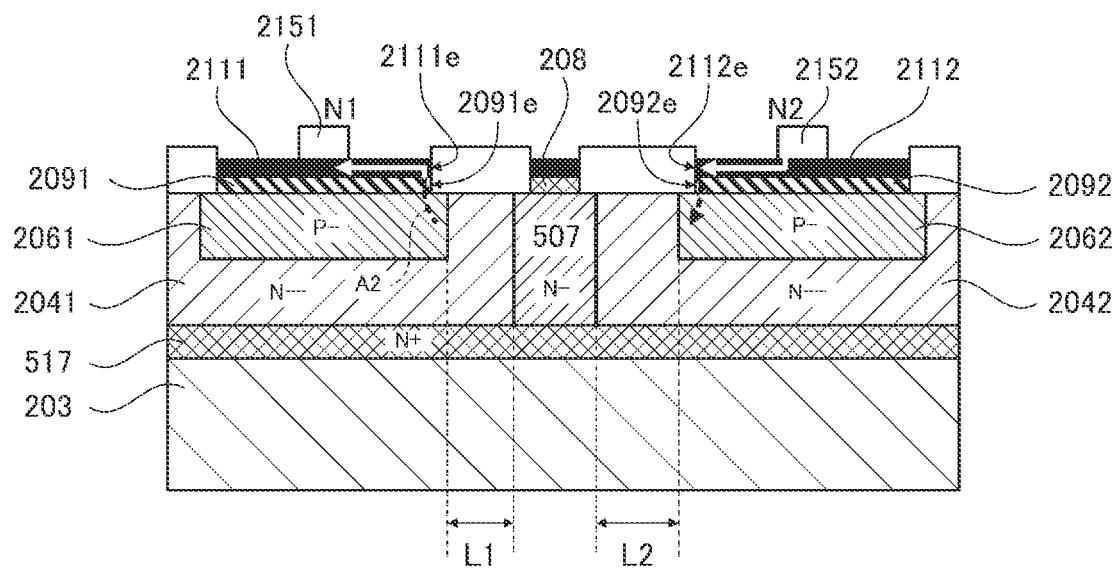
FIG. 5 is a cross-sectional view showing an example of a static electricity protection circuit where an end part of a first metal compound layer overlaps an end part of a first impurity region semiconductor layer.

In contrast to such a configuration according to this example, FIG. 5 shows an example where the end part 2111e of the metal compound layer 2111 is provided in such a way as to overlap the position of the end part 2091e of the impurity region semiconductor layer 2091. The metal compound layer 2111 has a lower impedance than the impurity region semiconductor layer 2091. Therefore, when the end part 2111e on the near side to the N− common impurity region 507, of the metal compound layer 2111, is stacked at the same position as the impurity region semiconductor layer 2091 in this way, the breakdown current flowing into the impurity region semiconductor layer 2091 via the P− impurity region 2061 tends to concentrate at the end part near the N− common impurity region 507, of the P− impurity region 2061, that is, in a relatively shallow region in the P− impurity region 2061, as in a current path A2 indicated by a dashed line and a white arrow in FIG. 5.

In contrast, in the configuration according to this example, as described above, the end part 2111e of the metal compound layer 2111 is spaced apart from the end part 2091e on the near side to the N− common impurity region 507, of the impurity region semiconductor layer 2091, toward the end part on the far side from the N− common impurity region 507, of the metal compound layer 2111. Thus, the path of the breakdown current flowing into the impurity region semiconductor layer 2091 via the P− impurity region 2061 is located farther from the N− common impurity region 507 than in the related art shown in FIG. 5. Therefore, the breakdown current flows via a deeper position in the P− impurity region 2061. This relaxes the concentration of electric power.

Similarly, as shown in FIG. 2, an end part 2112e on the near side to the N− common impurity region 507, of the metal compound layer 2112, that is, the end part on the left side of the metal compound layer 2112 in FIG. 2, is spaced apart from an end part 2092e on the near side to the N− common impurity region 507, of the impurity region semiconductor layer 2092, toward the end part on the far side, that is, toward the end part on the right side of the metal compound layer 2112 in FIG. 2.

Figure 9:
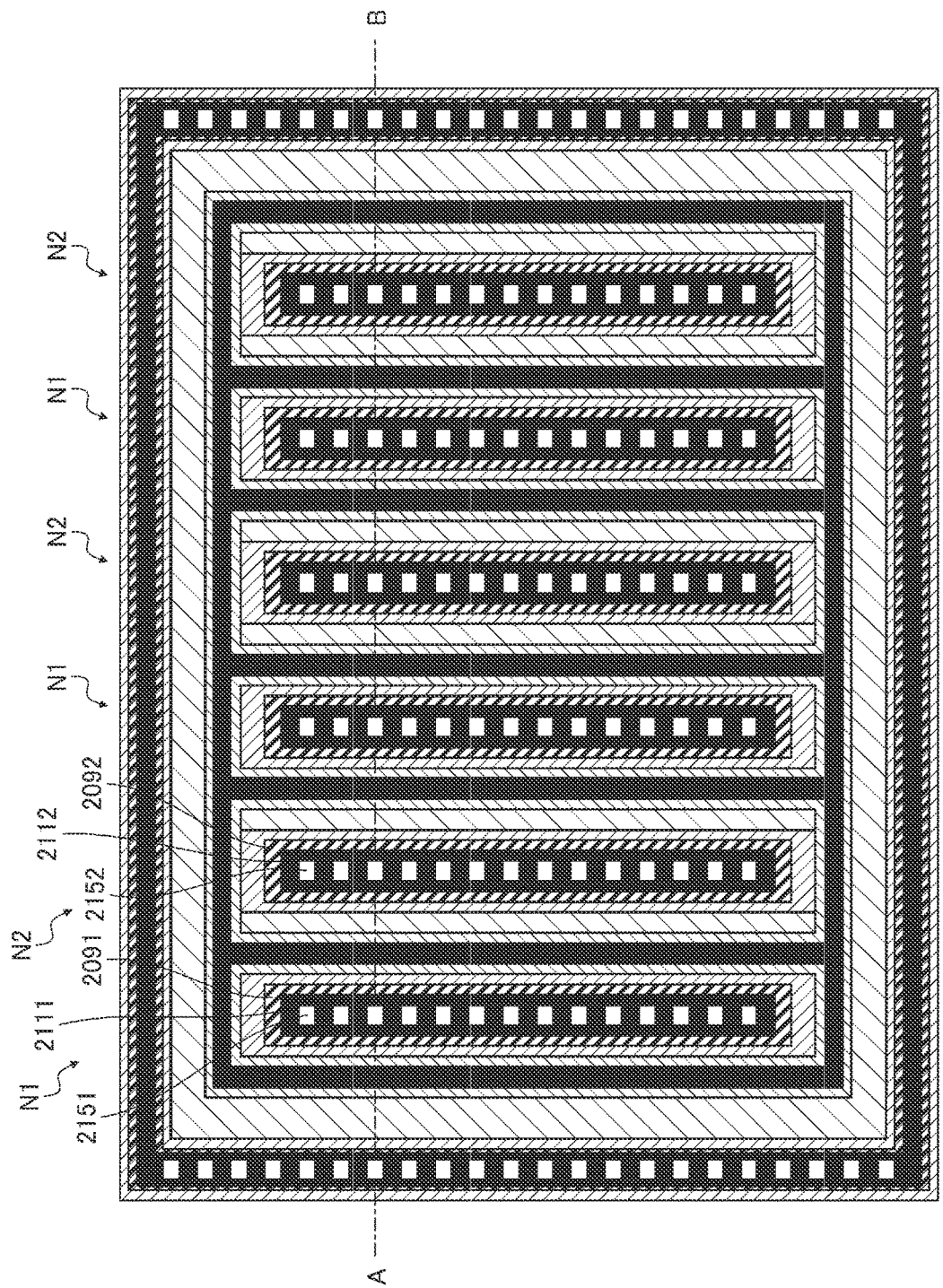
FIG. 9 is a plan view showing the configuration of the static electricity protection circuit applied to a semiconductor device.
Figure 10:
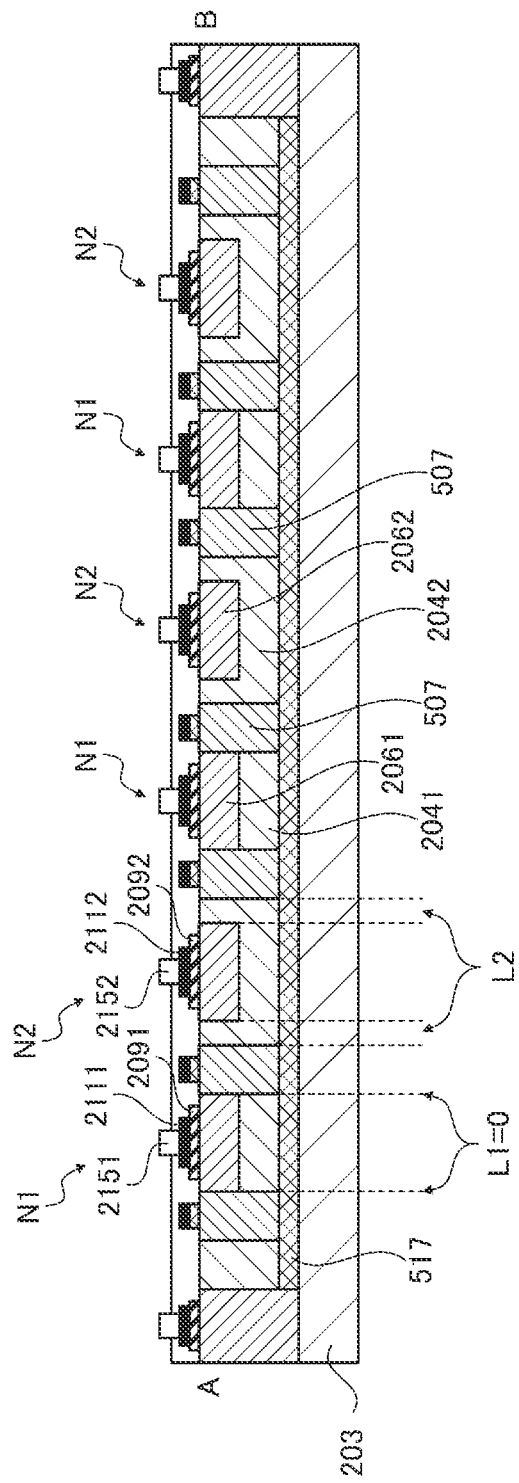
FIG. 10 is a cross-sectional view taken along a line A-B in FIG. 9.

In FIG. 2, the end part on the side opposite to the end part 2111e of the metal compound layer 2111 and the end part on the side opposite to the end part 2112e of the metal compound layer 2112 are similarly arranged at positions spaced apart inward from the end parts of the impurity region semiconductor layer 2091 and the impurity region semiconductor layer 2092, respectively. However, these end parts may be arranged at positions overlapping the end parts of the impurity region semiconductor layer 2091 and the impurity region semiconductor layer 2092 when there is no risk of concentration of electric power in these end part regions. The purpose of spacing the end parts apart on the two sides as shown in FIG. 2 is to cope with the inflow of the breakdown current from the two sides including the inflow of the breakdown current from left and right regions not illustrated in FIG. 2. Meanwhile, when the static electricity protection circuit 20a is applied to the semiconductor device 1, a plurality of the static electricity protection circuits 20a shown in FIG. 2 are arranged in parallel, as shown in FIGS. 9 and 10. Arranging a plurality of the static electricity protection circuits 20a in this way can increase the resistance as a static electricity protection circuit.

This example can achieve the effects described below.

In the static electricity protection circuit 20a, the circuit including the diode 201 and the diode 202 coupled in the opposite directions to each other can protect the internal circuit 10, which is the protection target circuit, from the applied static electricity.

The diode 201 formed by the P− impurity region 2061 and the N−−semiconductor region 2041, and the diode 202 formed by the P− impurity region 2062 and the N−−semiconductor region 2042, are coupled in the opposite directions to each other via the N− common impurity region 507. The N−−semiconductor region 2041, the N−−semiconductor region 2042, and the N− common impurity region 507 are provided in the upward direction from the N+ embedded region 517 and coupled to the N+ embedded region 517. Therefore, the breakdown current flowing between the P− impurity region 2061 and the P− impurity region 2062 flows in a dispersed manner from the vicinity of the surface of the multilayer structure of the semiconductor substrate into the N+ embedded region 517 having a lower impedance, that is, flows from the vicinity of the surface of the multilayer structure to the deep side. Thus, even when the breakdown voltage of the diode 201 and the diode 202, that is, the hold voltage, is configured to be high and the breakdown current is increased, the generation of heat due to the concentration of electric power is dispersed and therefore the destruction of the static electricity protection circuit 20 is restrained.

The distance L1 between the P− impurity region 2061 and the N− common impurity region 507 and the distance L2 between the P− impurity region 2062 and the N− common impurity region 507 differ from each other. As the distance L1 and the distance L2 differ from each other, the positive hold voltage and the negative hold voltage can be made different from each other.

In the static electricity protection circuit 20a, the end part 2111e on the near side to the N− common impurity region 507, of the metal compound layer 2111, is spaced apart from the end part 2091e on the near side to the N− common impurity region 507, of the impurity region semiconductor layer 2091, toward the end part on the far side. The breakdown current flowing between the P− impurity region 2061 and the P− impurity region 2062 flows in a dispersed manner to a deeper position in the P− impurity region 2061 than when the end part 2111e on the near side to the N− common impurity region 507, of the metal compound layer 2111, is arranged at a position overlapping the end part 2091e on the near side to the N− common impurity region 507, of the impurity region semiconductor layer 2091. Thus, the generation of heat due to the concentration of electric power is dispersed to a deeper position and therefore the destruction of the static electricity protection circuit 20 can be restrained.

Also, in the static electricity protection circuit 20a, the end part 2112e on the near side to the N− common impurity region 507, of the metal compound layer 2112, is spaced apart from the end part 2092e on the near side to the N− common impurity region 507, of the impurity region semiconductor layer 2092, toward the end part on the far side. The breakdown current flowing between the P− impurity region 2061 and the P− impurity region 2062 flows in a dispersed manner to a deeper position in the P− impurity region 2062 than when the end part 2112e on the near side to the N− common impurity region 507, of the metal compound layer 2112, is arranged at a position overlapping the end part 2092e on the near side to the N− common impurity region 507, of the impurity region semiconductor layer 2092. Thus, the generation of heat due to the concentration of electric power is dispersed to a deeper position and therefore the destruction of the static electricity protection circuit 20 can be restrained.

Figure 6:
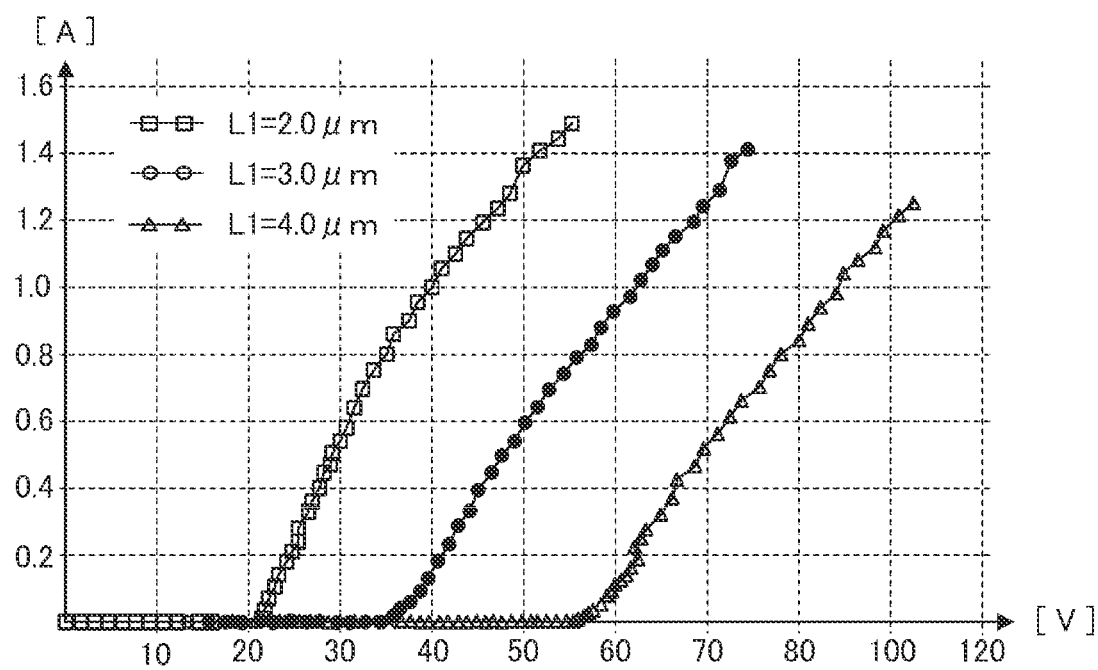
FIG. 6 is a graph showing the withstand voltage characteristic of a first diode included in the static electricity protection circuit according to the embodiment.

FIG. 6 shows the withstand voltage characteristic of the diode 201 in the static electricity protection circuit 20a having the above configuration. When the distance L1 is 2.0 µm, destruction does not occur up to a hold voltage of approximately 22 to 55 V and just over 1.5 A, that is, up to approximately 83 W. Even when the distance L1 is 4.0 µm, destruction does not occur up to a hold voltage of approximately 55 to 105 V and 1.2 A, that is, up to a range above 120 W.

In the static electricity protection circuit 20a, the first conductivity type is N-type and the second conductivity type is P-type. Therefore, the static electricity protection circuit 20 having excellent characteristics can be implemented, using a P-type substrate, which is used generally and broadly.

The semiconductor device 1 has the static electricity protection circuit 20a. Thus, the semiconductor device 1 can be protected from the applied static electricity more effectively and for a longer period.

Example 2

Figure 7:
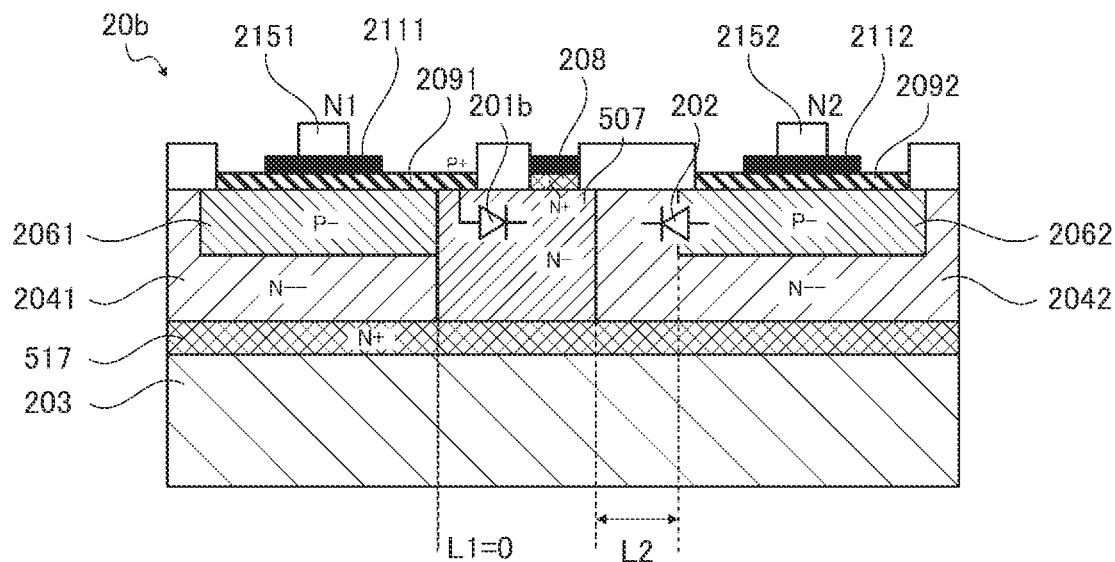
FIG. 7 is a cross-sectional view schematically showing a configuration of a static electricity protection circuit according to Example 2 of the embodiment.

Example 2 will now be described with reference to FIG. 7.

In Example 1, the positive hold voltage and the negative hold voltage can be made different from each other by making the distance L1 and the distance L2 different from each other. However, there is a case where the hold voltage may become excessively high, for example, even when the distance L1 contributing to one hold voltage is 0 µm. In this case, the electrostatic withstand voltage of the internal circuit 10 needs to be designed to be higher than the hold voltage. To cope with this, in a static electricity protection circuit 20b according to this example, the impurity region semiconductor layer 2091 is spaced apart from the common impurity region semiconductor layer 208 in the upward direction from the P– impurity region 2061 and the N– common impurity region 507 and extends over the N– common impurity region 507 from the P– impurity region 2061, and is coupled to the P– impurity region 2061 and the N– common impurity region 507, as shown in FIG. 7. Thus, the reverse voltage of a diode 201b formed by the impurity region semiconductor layer 2091 and the N– common impurity region 507 is lower than the reverse voltage of the diode 201 formed by the P– impurity region 2061 and the N–-semiconductor region 2041 in the static electricity protection circuit 20a according to Example 1.

In the case of such a configuration, the distance L1 may be L1≠0. When L1≠0, the structure of the diode coupled in parallel to the diode having the P+ N– structure is the P– N–-structure. Meanwhile, when L1=0, the structure of the diode coupled in parallel is the P– N– structure and has a lower breakdown voltage than the P– N–-structure. Therefore, the current at the time of discharge is dispersed and the breaking current of the protection element can be increased further.

In the static electricity protection circuit 20b, the diode 201b having a lower reverse voltage, that is, a lower hold voltage, than the diode 201 formed in the static electricity protection circuit 20a according to Example 1, can be configured. Thus, a rise in voltage induced in the internal circuit 10 by applied static electricity can be restrained. That is, even the internal circuit 10 having a relatively low electrostatic withstand voltage can be protected.

Figure 8:
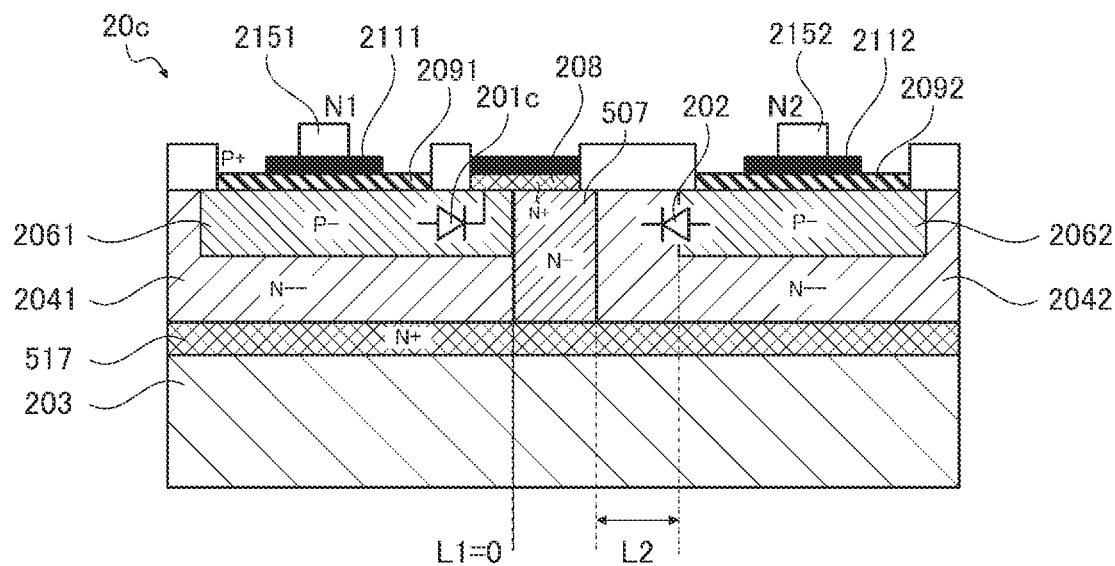
FIG. 8 is a cross-sectional view schematically showing another configuration of the static electricity protection circuit according to Example 2 of the embodiment.

FIG. 8 shows a static electricity protection circuit 20c as another example of Example 2. In this example, the common impurity region semiconductor layer 208 is spaced apart from the impurity region semiconductor layer 2091 in the upward direction from the P– impurity region 2061, the N–-semiconductor region 2041, and the N– common impurity region 507, and extends over the N– common impurity region 507 from the P– impurity region 2061, and is coupled to the P– impurity region 2061 and the N– common impurity region 507. Thus, the reverse voltage of a diode 201c formed by the P– impurity region 2061 and the common impurity region semiconductor layer 208 is lower than the reverse voltage of the diode 201 formed by the P– impurity region 2061 and the N–-semiconductor region 2041 in the static electricity protection circuit 20a according to Example 1.

In the case of such a configuration, the distance L1 may be L1≠0. When L1≠0, the structure of the diode coupled in parallel to the diode having the P+N– structure is the P– N–-structure. Meanwhile, when L1=0, the structure of the diode coupled in parallel is the P– N– structure and has a lower breakdown voltage than the P– N–-structure. Therefore, the current at the time of discharge is dispersed and the breaking current of the protection element can be increased further.

In the static electricity protection circuit 20c, the diode 201c having a lower reverse voltage, that is, a lower hold voltage, than the diode 201 formed in the static electricity protection circuit 20a according to Example 1, can be configured. Thus, a rise in voltage induced in the internal circuit 10 by applied static electricity can be restrained. That is, even the internal circuit 10 having a relatively low electrostatic withstand voltage can be protected.

Example 2 is described as a modification example of the configuration of the diode 201. The diode 202 can be similarly configured.

Electronic Apparatus

An electronic apparatus according to the embodiment will now be described with reference to FIG. 11.

Figure 11:
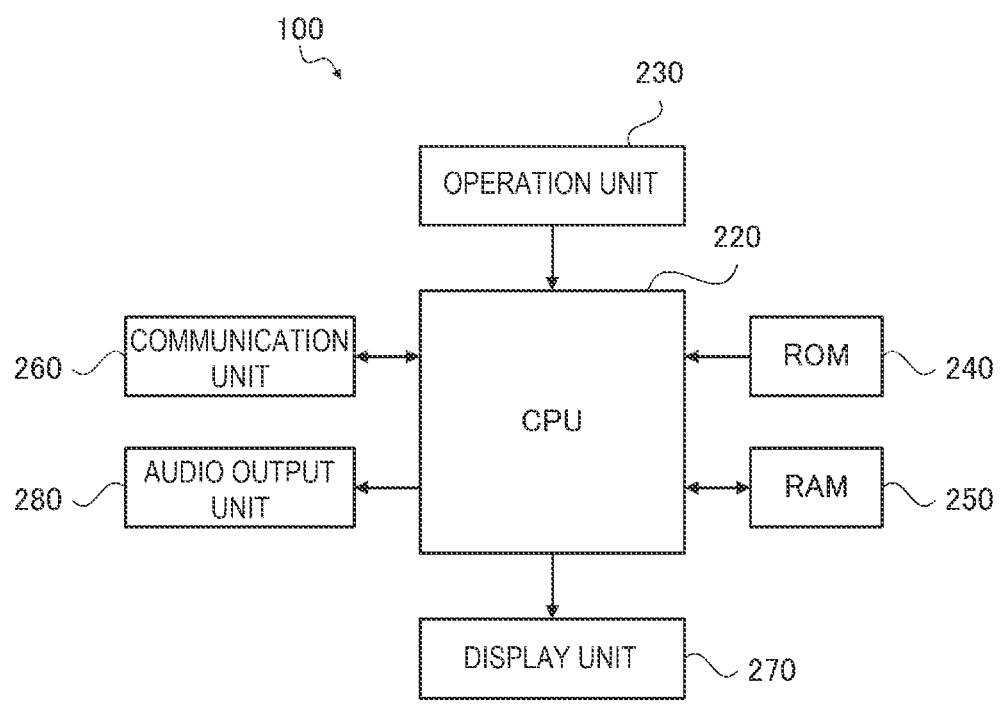
FIG. 11 is a block diagram showing an example of the configuration of an electronic apparatus according to the embodiment.

An electronic apparatus 100 according to this embodiment has a CPU 220, an operation unit 230, a ROM 240, a RAM 250, a communication unit 260, a display unit 270, and an audio output unit 280, as shown in FIG. 11. CPU means central processing unit. ROM means read-only memory. RAM means random-access memory.

At least a part of the CPU 220, the ROM 240, the RAM 250, the communication unit 260, the display unit 270, and the audio output unit 280 is built in the semiconductor device 1 according to the embodiment, though not illustrated. That is, the electronic apparatus 100 has the semiconductor device 1 including the internal circuit 10 as a functional unit implementing various functions and the foregoing static electricity protection circuit 20, as built-in components. Thus, in the semiconductor device 1, the built-in CPU 220 or the like can be protected from static electricity and abnormal signals or the like. The electronic apparatus 100 can be configured as a more reliable electronic apparatus since the semiconductor device 1 is protected from applied static electricity more effectively and for a longer period.

A part of the component elements shown in FIG. 11 may be omitted or changed. Also, another component element may be added to the component elements shown in FIG. 11.

The CPU 220 executes various kinds of signal processing and control processing according to a program stored in the ROM 240 or the like and using data or the like supplied from outside. For example, the CPU 220 executes various kinds of signal processing in response to an operation signal supplied from the operation unit 230, controls the communication unit 260 to perform data communication with outside, generates an image signal for causing the display unit 270 to display various images, and generates an audio signal for causing the audio output unit 280 to output various sounds.

The operation unit 230 is, for example, an input device including an operation key and a button switch or the like and outputs an operation signal corresponding to an operation by a user, to the CPU 220. The ROM 240 stores a program and data or the like for the CPU 220 to execute various kinds of signal processing and control processing. The RAM 250 is used as a work area for the CPU 220 and temporarily stores a program and data read out from the ROM 240, data inputted using the operation unit 230, or a result of computation or the like executed by the CPU 220 according to a program.

The communication unit 260 is formed, for example, by an analog circuit and a digital circuit and performs data communication between the CPU 220 and an external device. The display unit 270 includes, for example, an LCD, and displays various images based on an image signal supplied from the CPU 220. LCD means liquid crystal display.

The audio output unit 280 includes, for example, a speaker or the like, and outputs a sound based on an audio signal supplied from the CPU 220.

Such an electronic apparatus 100 may be, for example, a timepiece such as a wristwatch or a table clock, a timer, a mobile terminal such as a mobile phone, a digital still camera, a digital movie player, a television set, a video phone, a security monitor, a head-mounted display, a personal computer, a printer, a network device, a multifunction device, an on-vehicle device, an electronic calculator, an electronic dictionary, an electronic game device, a robot, a measuring device, a medical device or the like.

What is claimed is:

1. A static electricity protection circuit coupled in parallel to a protection target circuit, the static electricity protection circuit comprising:
    a first semiconductor region and a second semiconductor region that are of a first conductivity type;
    a common impurity region having a higher carrier concentration of the first conductivity type than the first semiconductor region and the second semiconductor region;
    an embedded region having a higher carrier concentration of the first conductivity type than the common impurity region; and
    a first impurity region and a second impurity region that are of a second conductivity type, wherein
    the embedded region is provided, extending over a surface in a stacking direction that is one surface of a semiconductor substrate of the second conductivity type,
    the first semiconductor region, the second semiconductor region, and the common impurity region are provided in the stacking direction from the embedded region and coupled to the embedded region,
    the first semiconductor region and the second semiconductor region are coupled together via the common impurity region,
    the first impurity region is provided in the stacking direction from the first semiconductor region and coupled to the first semiconductor region,
    the second impurity region is provided in the stacking direction from the second semiconductor region and coupled to the second semiconductor region, and
    a first diode formed by the first impurity region and the first semiconductor region and a second diode formed by the second impurity region and the second semiconductor region are coupled in opposite directions to each other via the common impurity region.

2. The static electricity protection circuit according to claim 1, wherein
    a distance between the first impurity region and the common impurity region and a distance between the second impurity region and the common impurity region differ from each other.

3. The static electricity protection circuit according to claim 1, further comprising:
    a first electrode;
    a first impurity region semiconductor layer having a higher carrier concentration of the second conductivity type than the first impurity region; and
    a first metal compound layer, wherein
    the first impurity region semiconductor layer is provided in the stacking direction from the first impurity region and coupled to the first impurity region,
    the first metal compound layer is provided in the stacking direction from the first impurity region semiconductor layer and coupled to the first impurity region semiconductor layer,
    the first electrode is provided in the stacking direction from the first metal compound layer and coupled to the first metal compound layer, and
    an end part on a near side to the common impurity region, of the first metal compound layer, is spaced apart from an end part on a near side to the common impurity region, of the first impurity region semiconductor layer, toward an end part on a far side.

4. The static electricity protection circuit according to claim 1, further comprising:
    a second electrode;
    a second impurity region semiconductor layer having a higher carrier concentration of the second conductivity type than the second impurity region; and
    a second metal compound layer, wherein
    the second impurity region semiconductor layer is provided in the stacking direction from the second impurity region and coupled to the second impurity region,
    the second metal compound layer is provided in the stacking direction from the second impurity region semiconductor layer and coupled to the second impurity region semiconductor layer,
    the second electrode is provided in the stacking direction from the second metal compound layer and coupled to the second metal compound layer, and
    an end part on a near side to the common impurity region, of the second metal compound layer, is spaced apart from an end part on a near side to the common impurity region, of the second impurity region semiconductor layer, toward an end part on a far side.

5. The static electricity protection circuit according to claim 3, further comprising:
    a common impurity region semiconductor layer having a higher carrier concentration of the first conductivity type than the common impurity region, wherein
    the first impurity region semiconductor layer is spaced apart from the common impurity region semiconductor layer in the stacking direction from the first impurity region and the common impurity region, extends over the common impurity region from the first impurity region, and is coupled to the first impurity region and the common impurity region.

6. The static electricity protection circuit according to claim 3, further comprising:
a common impurity region semiconductor layer having a higher carrier concentration of the first conductivity type than the common impurity region, wherein
the common impurity region semiconductor layer is spaced apart from the first impurity region semiconductor layer in the stacking direction from the first impurity region, the first semiconductor region, and the common impurity region, extends over the common impurity region from the first impurity region, and is coupled to the first impurity region and the common impurity region.

7. The static electricity protection circuit according to claim 1, wherein
the first conductivity type is N-type and the second conductivity type is P-type.

8. A semiconductor device comprising the static electricity protection circuit according to claim 1.

9. An electronic apparatus comprising the semiconductor device according to claim 8.

* * * * *